United States Patent [19]

Romano'

[11] Patent Number: 4,887,149
[45] Date of Patent: Dec. 12, 1989

[54] SEMICONDUCTOR DEVICE MOUNTED IN A HIGHLY FLEXIBLE, SEGMENTED PACKAGE, PROVIDED WITH HEAT SINK

[75] Inventor: Luigi Romano', Monza, Italy

[73] Assignee: SGS Microelectronica S.p.A., Catania, Italy

[21] Appl. No.: 72,924

[22] Filed: Jul. 14, 1987

[30] Foreign Application Priority Data

Jul. 17, 1986 [IT] Italy .................. 83632 A/86

[51] Int. Cl.⁴ ................ H01L 23/30; H01L 23/28; H01L 23/34
[52] U.S. Cl. .................................. 357/81; 357/79; 357/74
[58] Field of Search ........... 357/67, 72, 74, 80, 357/81, 82, 79; 174/16 HS, 52 FP

[56] References Cited

U.S. PATENT DOCUMENTS

| | | | |
|---|---|---|---|
| 3,839,660 | 10/1974 | Stryker | 357/74 |
| 4,100,566 | 7/1978 | Okikawa et al. | 357/79 |
| 4,224,663 | 9/1980 | Maiese et al. | 357/81 |
| 4,361,720 | 11/1982 | Resneau et al. | 174/16 HS |
| 4,577,387 | 3/1986 | Kaufman | 174/16 HS |
| 4,777,520 | 10/1988 | Nambu et al. | 357/72 |

FOREIGN PATENT DOCUMENTS 54-43676 6/1979 Japan .
56-215647 7/1983 Japan .
59-161055 9/1984 Japan .

Primary Examiner—Rolf Hille
Assistant Examiner—S. V. Clark
Attorney, Agent, or Firm—Bierman and Muserlian

[57] ABSTRACT

A package for semiconductor devices provided with an encased metallic heat sink, wherein an encapsulating body of resin extends beyond the perimenter of the heat sink to form two side extensions, diametrically opposite with respect to a central portion of the body and elastically de-coupled from such a central portion of the resin body containing the heat sink and the semiconductor chip, by means of at least a thinned out zone of the resin body determined by one or more pairs of opposite grooves. Fastening points contemplated in said lateral extensions, are efficiently elastically de-coupled from the central portion of the body and the package is essentially free to blend along said pairs of opposite grooves without inducing stresses on the encased metallic heat sink onto which rests the semiconductor chip.

5 Claims, 2 Drawing Sheets

SEMICONDUCTOR DEVICE MOUNTED IN A HIGHLY FLEXIBLE, SEGMENTED PACKAGE, PROVIDED WITH HEAT SINK

The present invention relates, in general, to semiconductor devices and to the fabrication techniques thereof. More in particular, the invention relates to a semiconductor device mounted in a package which is provided with means for increasing heat dissipation and which is substantially flexible.

Within the broader manufacturing art of semiconductor devices and besides the development of integration techniques and of the relevant fabrication processes, new types of packages which could answer in an increasingly efficient way to the peculiar requirements of various types of devices have been developed.

The package, i.e. the encapsulation enclosing the semiconductor device and protecting it from the environment as well as providing means for mounting it and connecting it on circuit cards, must correspond to requirements which change along with the development of the packing density per unit area of the semiconductor chip within an integrated circuit (e.g. need for an ever increasing number of pins), with the necessity of minimizing the dimensions of the package, and/or with the necessity of providing a certain heat dissipation capacity. Several types of integrated circuits require a substantial capacity of dissipating heat (generated by Joule's effect within the semiconductor die), which is not obtainable through a normal dissipation by convention and radiation through the external surface of the package which is generally of thermo-setting resin and of the external pins, also considering that, in order to reduce dimensions, the packages themselves are as small as possible and offer, therefore, a reduced heat dissipating area. In these cases it is known to use special packages formed essentially by a metal base or substrate, preferably of (nickel plated) copper, constituting the bottom of the package. The semiconductor die is conveniently rested on the surface of such a copper heat sink and, providing suitable pins for the external connections of the integrated circuit, the semiconductor die (or chip) is entirely encapsulated in a body of resin formed over the top surface of such a metal base.

The external (bottom) surface of such a metal base may thence be mounted in a close contact with a suitable external heat sink which may thus have practically unlimited size and onto which may be assembled a large number of devices. Naturally, in order to ensure a good adherence between the metal base of the integrated circuit package and the external heat sink, it is necessary to provide suitable fastening means.

One of the fastening means more common is to use one or more bolts or screws passing through appropriate holes formed through said metal base of the package.

A peculiar problem connected with this type of packages concerns the possibility of inducing mechanical stresses into the semiconductor die caused by unevennesses of the surface of the external heat sink upon mounting the device on such a surface or caused by deformations of such a surface produced by the thermal expansion to which the metal constituting the external heat sink is subjected. Such unevennesses (e.g. convexities or concavities of the surface) are not easily recognizable by the assembling workman.

The risk connected with such occurrences is not only bound to the possibility of mechanical failures of the semiconductor die housed within the package, but also to the loss of adherence or mismatch between the external surface of the metal base of the package and the surface of the external heat sink which may cause an overheating of the device with attendant degradation of its characteristics leading to failure.

With the aim of overcoming or reduce the problem, some new configurations of such a type of packages have been proposed and which, substantially, tend to provide the base metal plate of the package with a preferential zone of flection created by thinning out the thickness of the metal plate between an extremity thereof provided with the fixing hole and the portion thereof onto which rests the semiconductor die encapsulated within the resin.

An example of such proposals is represented by the Japanese patent application No. 52-109878 of 9.14.1977, published with No. 54-43676 on 4.6.1979.

Such a configuration is not exempt of problems and of drawbacks and above all it does not completely and in an optimal way solve the above noted technical problem.

Firstly, the elastic de-coupling between the fastening points or segments of the metal plate acting as a heat sink substrate of the package with respect to a central portion or segment of the metal plate itself onto which rests the semiconductor crystal chip (or die) and onto which the encapsulating resin body is formed, can be only partial in order not to thin out excessively the metal which fact would reduce excessively the heat conducting cross section of the heat sink base plate. This because, typically, it is the appendix of the metal plate fastened to the surface of the external heat sink by means of a fastening screw or bolt which provides for the main thermal coupling area with the external heat sink. The metal of which the metal plate is formed has intrinsically a non-negligeable elastic modulus, therefore, even providing to thin out the section of the plate for creating preferential flection zones of the same, it is impossible to prevent completely transmission of a certain bending moment also to the central portion of the metal plate. Moreover the fabrication of such a type of packages contemplates several machining operations such as: cutting the notches in the flection zones, eventual machining of the surface of the central portion of the metal plate for facilitating the formation and the sealingly perfect adherence of the body of resin, encapsulating the semiconductor die and the wire leads connected to the pins.

A further drawback of such a type of packages is due to the fact that the shrinkage of the encapsulating resin tends to induce deformations and loss of planarity of the metal base plate.

The package object of the present invention provides an optimal solution to the above noted problems without the drawbacks shown by the packages of the prior art.

According to the present invention, the metal base plate forming the heat sink of the package is entirely contained within the perimeter of the body of encapsulating resin and is completely de-coupled, elastically, from the fastening points or segments of the package.

Such a metal plate has preferably, although not necessarily, a circular shape. A preferred shape is that of a disk of nickel plated copper, or of another comparable material which is a good heat conductor, almost entirely encased in the bottom of a resin body and, practically, protruding by a fraction only of its thickness out of the planar surface of the encasing resin.

The resin body of the package is segmented in three sections or portions. On two sides, diametrically opposite one from the other, of a central portion, within which is encased such a metal disk and which also contains the semiconductor die, extend two side portions or segments which are mechanically connected to the central portion through, respectively, a thinned out zone of the resin body.

Such a thinned out zone is obtained by one or more pairs of notches or grooves whose vertexes may be directly opposed one to the other(or even slightly offset in respect of a perfect alignment), formed on both major surfaces of said resin body which customarily has a substantially flat shape. The depth of such opposing grooves is such as reduce the thickness of the resin body within such a thinned out zone, to about 50% of the thickness of the resin body.

Such side portions or segments are provided with holes or slots or notches apt to receive fastening screws or bolts for mounting the device on the surface of an external heat sink.

The two flection zones, represented by the two zones of the resin with such a thinned out section or thickness which separate the three "segments" of the resin body of the package of the device, tied to the fact that resin possesses an elasticity modulus essentially much lower than that of a metal, ensure a substantially perfect, elastic de-coupling of the metal plate, completely encased in the bottom of the central portion of the resin body, from the fastening points of the package to the external heat sink. In this way, tension or beding stresses due to unevennesses of the planarity of the surfaces and/or to thermally induced deformations are effectively prevented from being transmitted, through the heat sink metal plate, to the semiconductor die.

The use of thermoplastic resins having a low elasticity modulus and a higher resiliency in respect of thermosetting resin is particularly preferred, according to the best embodiment of the present invention. It allows to further improve the effectiveness of the package of the invention in respect of overcoming the above noted technical problems.

In any case, the package of the invention remains advantageous in respect of comparable packages of the prior art even when normal thermosetting resins are used for making the encapsulating body of the package.

The invention and its advantages will be more easily pointed out through the detailed description, having a purely illustrative and nonlimitative purpose, of a particularly preferred embodiment thereof with reference to the annexed drawings, wherein.

Figure 1:
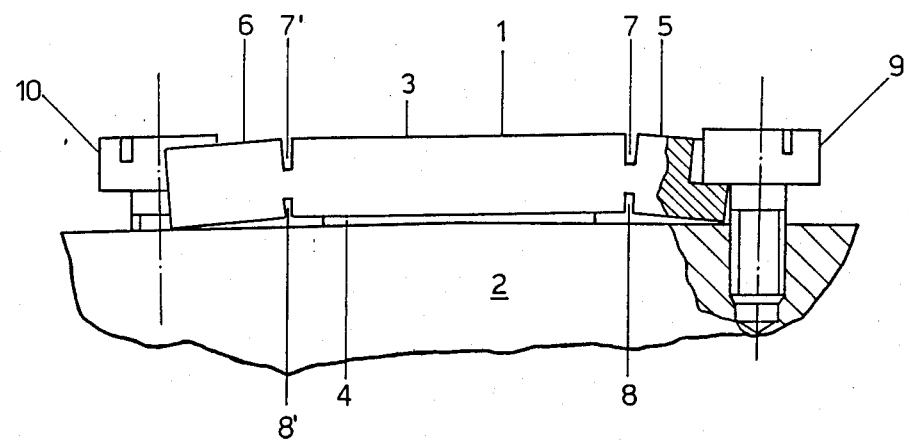
FIG. 1 shows a device of the present invention fastened on the surface of an external heat sink.

In FIG. 1 the way by which a device according to the present invention, indicated with 1, may be assembled on an external heat sink 2 may be easily observed. The central portion 3 of the device, containing the semiconductor chip, is provided with a metal plate for the heat dissipation, partially encased in the resin forming the encapsulation of the integrated circuit. Such a metal plate 4 is completely contained within the perimeter of the central portion 3. The resin body of the package is provided with two side portions, respectively 5 and 6, defined, in respect of the central portion 1, by a pair of opposite grooves or notches 7 and 8, and 7' and 8', respectively, in correspondence to which, the thickness of the body of resin is reduced to about 40–80% of its full thickness.

Two fastening screws, respectively 9 and 10, partially received into suitable semi-circular notches formed in both the two side portions or segments 5 and 6 of the resin body, and screwed down into suitably threaded holes formed in the external heat sink 2, secure the device to the latter. As shown in FIG. 1, the readiness with which said two side portions of the resin body may flex in correspondence to such two necks, formed in the resin body by such pairs of opposite grooves 7, 8 and 7', 8', allows an effective mounting of the device on surfaces even not perfectly flat of an external heat sink 2 (in the case of FIG. 1, it is shown an appreciable convexity of such a mounting surface of the external heat sink 2). In this way one ensures, firstly, a good thermal coupling between the external surface of the heat sink metal plate 4 encased in the central portion 3 of the resin body and the surface of the external heat sink 2. The deformability of the resin body in correspondence to the flexible joints formed by the two pairs of grooves 7, 8 and 7', 84, ensures furthermore the maintenance of such a good thermal coupling also in case of deformations which may take place because of thermal expansion of the external heat sink 2 or because of slight mechanically induced deformations.

As it is easily recognizible, the metal plate 4, encased in the resin body of the package 1 and on the internal surface of which rests the semiconductor die, is effectively de-coupled in relation of bending stresses and of other types of stresses which may be transmitted to the chip of semiconductor crystal through the package from the fastening points, represented by the two screws 10 and 9.

Eventual flections or compressions are easily discharged within the resin in correspondence to the two flection zones defined by the pairs of grooves 7, 8 and 7', 8'.

Figure 2:
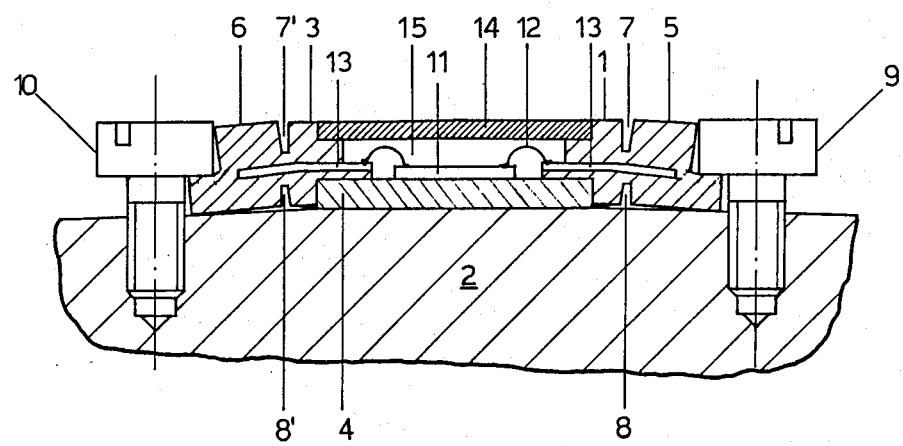
FIG. 2 is a cross section of the mounted device of FIG. 1, illustrating the various parts forming the device.

A complete cross section of the device of the invention of FIG. 1 is shown in FIG. 2. The package 1 is preferably of the pre-molded type, i.e. it is fabricated by molding the resin body 1 (encasing the plate or metallic disk 4 in the bottom of the central portion 3 of the resin body and the frame 13 formed by a plurality of coplanar metal sectors which will constitute the external pins for the electrical connection to the device to the external circuit) and by forming a cavity 15 in correspondence of a central region of the top surface of the metal plate 4 encased at the bottom of the package. Naturally, the various sectors of the frame 13 are encapsulated in a way as to be electrically insulated from the metal plate 4. The grooves or notches 7, 8 and 7', 8' may be conveniently formed upon molding the resin body, however they may also be formed later.

The heat sink plate 4 is preferably a nickel plated copper disk, so as the frame 13. Preferably but not necessarily, the resin used to form the body of the package is a thermoplastic resin formed by application of heat and pressure in a suitable mold. Examples of usable resins are: polyphenylsulfide resins (RITOH), polyamidic resins (NORYL), epoxy resins (MITTO, MP150), metacrylic resins, etc.

The semiconductor chip 11 is mounted on the surface of the heat sink plate 4 and connecting wires 12 are welded on respective connection areas present on the surface of the semiconductor chip 11 and to the respective sector or pin of the frame 13.

A pre-formed plug of thermoplastic resin 14 may then be positioned for closing at the top the cavity 15 housing the semiconductor chip and it may be melt welded to the pre-formed body of resin 1 along the perimeter.

Figure 3:
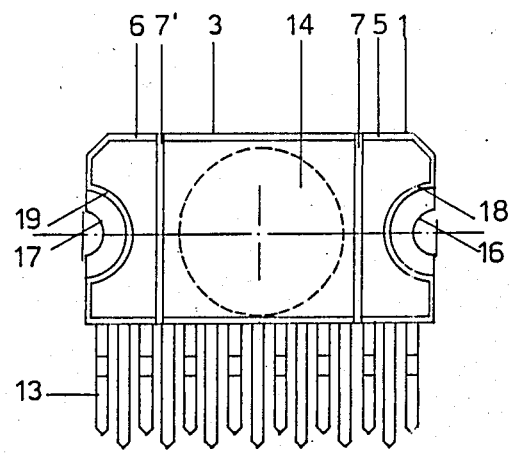
FIGS. 3 and 4 are two views, perpendicular one to the other, of a semiconductor device made in accordance with the present invention.
Figure 4:
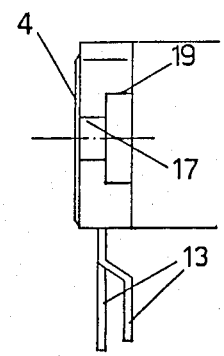

In FIGS. 3 and 4 is shown an example of a finished device. The shape of the pins is purely indicative and other shapes, adapted to the contemplated use are possible. In the front view of FIG. 3, the array of pins are indicated with 13 in their totality and the package 1 is segmented into a central portion 3 and two side portions, respectively 5 and 6, by means of two pairs of opposite grooves 7 and 7'. Two notches or indentations with a semicircular shape 16 and 17 are formed, respectively, on the lateral edge of the two side portions 5 and 6 of the segmented package for receiving the threaded stem of the assembly screws 9 and 10 (FIGS. 1 and 2). Preferably, a semicircular cavity (18, 19), substantially coaxial with the semicircular indentations 16 and 17, is also formed for receiving, at least partially, the crown or head of the assembly screws. The profile of the sealing plug 14 is indicated by the dash line circle inscribed inside the perimeter of the central portion 3 of the resin body of the package.

In the lateral view of the same device shown in FIG. 4, the protruding profile of the metal disk 4, encased in the bottom of the central portion of the resin package, is visible.

Figure 5:
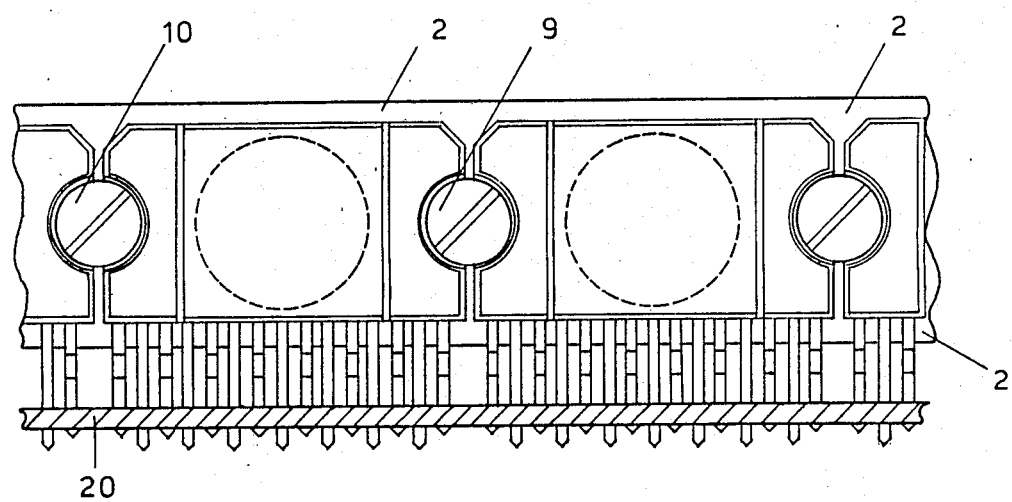
FIG. 5 shows a way by which several devices of the invention may be assembled on the surface of a single external heat sink.

An example of the assembly arrangement of the devices of the invention on a integrated circuit card 20 is shown in FIG. 5. As it is easily observed, several devices of the invention may be assembled side by side on the card 20 and fastened to a single external heat sink 2 by means of screws 10, 9, ... etc. Also in case the external heat sink 2, which may be relatively very long for accommodating a large number of devices, be subject, because of thermal expansion, to moderate deformations, the devices of the invention, by virtue of their capacity of bending along the contemplated flection "lines", are capable of preserving the thermal coupling between the heat sink plate 4 encased in the package and the external heat sink 2, preventing, at the same time, transmission of mechanical stresses to the encased metal plate 4 onto which the semiconductor crystal is mounted.

Numerous modifications may be easily made to the shape, dimensions, arrangement and number of pins, arrangement of the fastening means and to the materials utilized in order to adapt the more general criterion of the present invention to peculiar practical requirements, though remaining within the spirit and scope of the present invention.

What I claim is:

1. A semiconductor device comprising essentially a chip of semiconductor material mounted on the surface of a heat sink metal body having two major surfaces parallel each other, a plurality of pins suitably connected by means of connecting wires to respective connecting areas on the surface of said semiconductor chip, a substantially parallelepiped body of resin having two major surfaces encapsulating said chip, said connecting wires, said pins, with the exception of their free end, and embedding on one of said major surfaces said heat sink metal body and means for fastening the device to an external supporting heat sink, wherein said resin body extends beyond the perimeter of said major surfaces of said metal body from two diametrically opposite sides of said perimeter forming two side segments of said parallelepiped body of resin; means for fastening the device being present in each of said side segments of said resin body; at least a pair of opposite grooves formed on both major surfaces of said resin body separating said side segments containing said fastening means from a central segment of said parallel piped body of resin embedding said metal body, providing a flection zone and mechanically de-coupling said side segments of the resin body from said metal body.

2. The semiconductor device according to claim 1 wherein the thickness of the resin body is reduced in respect of its full measure by a percentage comprised between 40 and 80% in correspondence of said opposite grooves.

3. The semiconductor device according to claim 1, wherein the fastening means of the device comprise a semicircular indentation on the lateral edge of said side segments of the resin body apt to receive the stem of a fastening screw.

4. The semiconductor device according to claim 1 wherein said heat sink metal body has the shape of a disk and protrudes by at least a fraction of its thickness from the major surface of the resin body on which it is embedded.

5. A package for semiconductor devices comprising a pre-formed thermoplastic body having a substantially parallelepiped shape and segmented in a central portion and two side portions which extend from two opposite sides of said central portion and contain means for fastening the package, by means of at least two pairs of grooves with their respective vertexes substantially opposed and formed respectively on two major surfaces of said parallelepiped resin body, said pairs of grooves determining, respectively, a flection zone mechanically separating said central portion from each of said two side portions; and a heat sink metal body embedded in the resin on a major surface of said central portion of the pre-formed resin body, the perimeter of said metal body being completely inscribed within the perimeter of said central portion of said pre-formed resin body.

* * * * *